United States Patent
Ong et al.

(10) Patent No.: US 8,163,604 B2
(45) Date of Patent: Apr. 24, 2012

(54) INTEGRATED CIRCUIT PACKAGE SYSTEM USING ETCHED LEADFRAME

(75) Inventors: You Yang Ong, Kuantan (MY); Cheong Chiang Ng, Cheras (MY); Suhairi Mohmad, Kuala Lumpur (MY)

(73) Assignee: STATS ChipPAC Ltd., Singapore (SG)

( * ) Notice: Subject to any disclaimer, the term of this patent is extended or adjusted under 35 U.S.C. 154(b) by 484 days.

(21) Appl. No.: 11/163,305

(22) Filed: Oct. 13, 2005

(65) Prior Publication Data
US 2007/0085199 A1    Apr. 19, 2007

(51) Int. Cl.
*H01L 21/60*    (2006.01)

(52) U.S. Cl. ........ 438/123; 438/111; 438/114; 438/124; 438/617; 257/720; 257/666; 257/675; 257/672; 257/723; 257/690; 257/E23.037; 257/E23.054

(58) Field of Classification Search .................. 257/720, 257/666, 675, 672, 723, 690, E23.037, E23.054; 438/111, 114, 123, 124, 617
See application file for complete search history.

(56) References Cited

U.S. PATENT DOCUMENTS

| | | | |
|---|---|---|---|
| 6,339,261 B1 | 1/2002 | Yonemochi et al. | 257/784 |
| 6,376,921 B1 | 4/2002 | Yoneda et al. | 257/787 |
| 6,423,643 B1 | 7/2002 | Furuhata et al. | 438/694 |
| 6,498,099 B1 * | 12/2002 | McLellan et al. | 438/689 |
| 6,643,136 B2 * | 11/2003 | Hsu | 361/719 |
| 6,818,973 B1 * | 11/2004 | Foster | 257/676 |
| 6,876,068 B1 * | 4/2005 | Lee et al. | 257/676 |
| 7,476,972 B2 * | 1/2009 | Takahashi | 257/773 |
| 2005/0012183 A1 * | 1/2005 | Chow et al. | 257/666 |
| 2005/0287710 A1 * | 12/2005 | Huang et al. | 438/123 |
| 2006/0035414 A1 * | 2/2006 | Park et al. | 438/124 |
| 2007/0029664 A1 * | 2/2007 | Mohammed et al. | 257/706 |

* cited by examiner

*Primary Examiner* — Junghwa M Im
(74) *Attorney, Agent, or Firm* — Ishimaru & Associates LLP; Mikio Ishimaru; Stanley Chang

(57) ABSTRACT

An integrated circuit package system includes a conductive substrate. A heat sink and a plurality of leads are etched in the substrate to define a conductive film connecting the heat sink and the plurality of leads to maintain their spatial relationship. A die is attached to the heat sink and wire bonded to the plurality of leads. An encapsulant is formed over the die, the heat sink, and the plurality of leads. The conductive film is etched away to expose the encapsulant and the bottom surfaces of the heat sink and the plurality of leads. Wave soldering is used to form solder on at least the plurality of leads. Multiple heat sinks and hanging leads are provided.

20 Claims, 5 Drawing Sheets

INTEGRATED CIRCUIT PACKAGE SYSTEM USING ETCHED LEADFRAME

TECHNICAL FIELD

The present invention relates generally to integrated circuit manufacturing, and more particularly to a system for manufacturing a non-leaded integrated circuit package system.

BACKGROUND ART

In the electronics industry, the continuing goal has been to reduce the size of electronic devices such as camcorders and portable telephones while increasing performance and speed. Integrated circuit packages for complex systems typically are comprised of a multiplicity of interconnected integrated circuit chips. The integrated circuit chips usually are made from an integrated circuit material such as silicon or gallium arsenide. Integrated circuit devices are formed in various layers of the integrated circuit chips using photolithographic techniques. The integrated circuit chips may be mounted in packages that are then mounted on printed wiring boards.

Integrated circuit packages including integrated circuit chips typically have numerous leads, or lead fingers, that are attached and connected by solder or a variety of other known techniques to conductor patterns on the printed wiring board.

Typically, the packages on which these integrated circuit chips are mounted include a substrate or other chip mounting device. One example of such a substrate is a leadframe.

Leadframes also typically include at least an area on which an integrated circuit chip is mounted and a plurality of power, ground, and/or signal leads to which power, ground, and/or signal sites of the integrated circuit chip are electronically attached. Integrated chips may be attached to the leadframe using adhesive or any other techniques for attaching such chips to a leadframe which are commonly known to those skilled in the art, such as soldering. The power, ground and signal sites on the chip may then be electrically connected to selected power, ground and signal plane or individual leads of the leadframe.

Leadframes have been used extensively in the integrated circuit (IC) packaging industry mainly because of their low manufacturing cost and high reliability. Integrated circuit packages using leadframes remain a cost-effective solution for packaging integrated circuit chips, particularly with the introduction of various leadless packages in recent years.

Typical leadframe packages include a die attach paddle, or pad, surrounded by a number of leads. The leads may be temporarily attached to the die attach paddle by a number of tie bars. The die attach paddle also may be a heat sink to help remove the heat generated by the integrated circuit during operation away from the integrated circuit chip.

An integrated circuit chip, is attached to the die attach paddle using a conductive adhesive such as silver epoxy. A dam bar may be used to prevent the conductive adhesive from flowing off the die attach paddle. The conductive adhesive is cured after die attach. After the die is attached to the die paddle, a wire-bonding process is used to make electrical interconnections between the integrated circuit and the leads of the leadframe. After wire bonding, the leadframe with the integrated circuit chip attached is encapsulated using a molding compound and the tie bars are removed.

Such enclosures may include encapsulation in a plastic or a multi-part housing made of plastic ceramic, or metal. The enclosure protects the leadframe and the attached chip from physical, electrical, and/or chemical damage.

After the molding compound has cured, post mold curing and singulation steps are conducted to complete the packaging process. Solder balls are attached to the bottom of the leads to provide a means of connecting the integrated circuit chip to a circuit board. Alternatively, solder is plated onto the bottom surfaces of the leads to create the suitable stand-off height required for board mounting of the semiconductor package.

The leadframe and attached integrated circuit chip(s) may then be mounted on, for example, a circuit board, or card along with other leadframes or devices. The circuit board or card may then be incorporated into a wide variety of devices such as computers, automobiles, and appliances, among others.

One problem that persists with leadframes is that as the integrated circuits are subject to miniaturization requiring integrated circuit packages having higher numbers of leads in intricate designs often including isolated heat sinks additional tie bars and dam bars are needed to hold these intricate design features together during manufacturing of the integrated circuit package.

Additionally, coverlay tape may be applied to the leadframe to provide support for the integrated circuit package during the wire bonding and molding operations. However, the taping provides a cushioning effect that absorbs some of the ultrasonic energy transmitted during the wire bonding process resulting in defective wire bonding.

Attempts have been made to use leadframes without tie bars or dam bars, but have proven unsuccessful. One such attempt uses a leadframe having a base portion that is used to connect the die attach paddle to the number of leads. After the molding operation is performed the base portion is removed using a grinding process to disconnect the die attach paddle from the leads. The grinding operation, however, introduces potentially harmful stresses, which can have an adverse effect on the function and reliability of the integrated circuit package.

Also, these attempts have been unable to provide a stable bonding platform for hanging heat sinks or leads during the wire bonding process. Additionally, dam bars are often required across all leads to hold and arrange the leads in their peripheral or dedicated location. This has resulted in design limitations for tie bar and dambar insertion, and the need for larger unusable space in leadframe designs.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including a conductive substrate. A heat sink and a plurality of leads are etched in the substrate to define a conductive film connecting the heat sink and the plurality of leads to maintain their spatial relationship. A die is attached to the heat sink and wire bonded to the plurality of leads. An encapsulant is formed over the die, the heat sink, and the plurality of leads. The conductive film is etched away to expose the encapsulant and the bottom surfaces of the heat sink and the plurality of leads. A solder wave process is used to form solder on at least the plurality of leads. Multiple heat sinks and hanging leads are provided.

The present invention provides a versatile and cost effective system for manufacturing integrated circuit package systems.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the device are semi-diagrammatic and not to scale and, particularly, some of the dimensions are for the clarity of presentation and are shown greatly exaggerated in the FIGs.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 1:
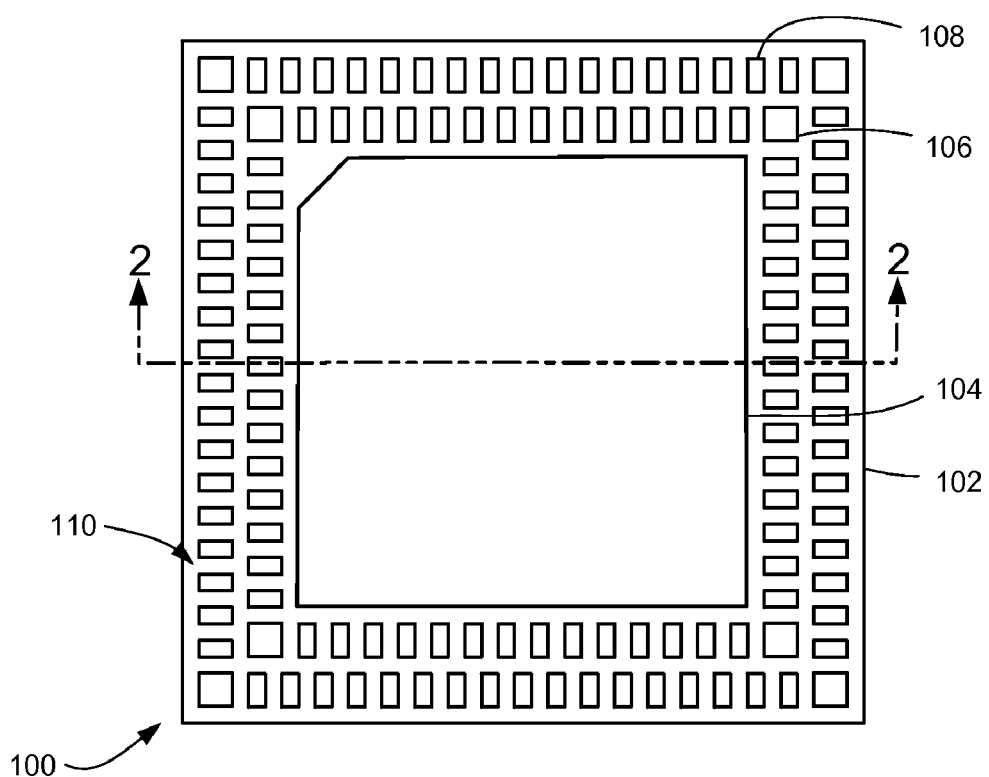
FIG. 1 is a plan view of an integrated circuit package system at an intermediate stage of manufacture in accordance with an embodiment of the present invention.

Referring now to FIG. 1, therein is shown a plan view of an integrated circuit package system 100 at an intermediate stage of manufacture in accordance with an embodiment of the present invention. The integrated circuit package system 100 includes a leadframe 102. The leadframe 102 is a conductive substrate, such as a copper (Cu) substrate, that has been processed to form a heat sink 104 surrounded by a number of inner leads 106 and a number of outer leads 108. The heat sink 104, the inner leads 106, and the outer leads 108 are formed by etching the conductive substrate using a selective depth chemical etch process. A conductive film 110 is thereby defined on the bottom of the leadframe 102 to physically connect and maintain the spatial relationship of the heat sink 104, the inner leads 106, and the outer leads 108.

Since the features on the lead frame 102 are supported by the conductive film 110 at the bottom of the lead frame 102, no conventional dambars or tie bars are needed to maintain the spatial relationship of the heat sink 104, the inner leads 106, and the outer leads 108. This results in a leadframe of a given size having the capability to accommodate more leads than a conventional leadframe of the same dimentions. For example, in a typical 56 lead quad flat pack non-leaded (QFN) integrated circuit package (not shown) the lead count can be increased from 56 leads to 60 leads due to the ability to provide additional leads at the four corners of the heat sink where the tie bars are usually located.

Figure 2:
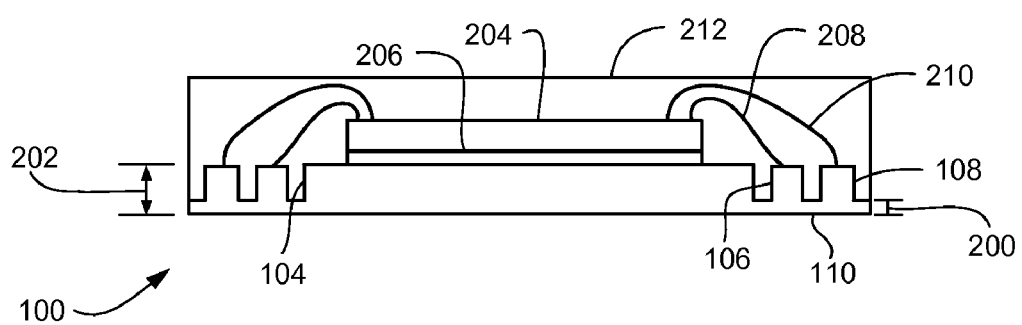
FIG. 2 is a cross-sectional view of the structure of FIG. 1 taken along line 2-2 after wire bonding and encapsulation.

Referring now to FIG. 2, therein is shown a cross-sectional view of the structure of FIG. 1 taken along line 2-2 after wire bonding and encapsulation. The selective depth etching process is selectively controllable to provide a film thickness 200 of typically about 3 mil for the conductive film 110. It has been discovered that the film thickness 200 of the conductive film 110 of about 3 mil is well suited for subsequent saw singulation processes using a diamond blade in accordance with standard integrated circuit manufacturing methods.

Accordingly, a conductive substrate having a thickness 202 of 5 mil has about 40 percent of its thickness etched away in forming the heat sink 104, the inner leads, 106, and the outer leads 108 to create the conductive film 110 having the film thickness 200 that is about 3 mil. A conductive substrate having a thickness 202 of 8 mil has about 62.5 percent of its thickness etched away to create the conductive film 110 having the film thickness 200 of about 3 mil. In the case of a conductive substrate having a thickness 202 of 20 mil has 85 percent of its thickness etched away to create the conductive film having the film thickness 200 of about 3 mil.

An integrated circuit, such as a die 204 is attached to the heat sink 104 of the leadframe 102 using a thermally conductive adhesive layer 206. The thermally conductive adhesive layer 206 may be a conductive tape, conductive paste, or other suitable thermally conductive adhesive.

The number of inner leads 106 is wire bonded to the die 204 using a first number of bond wires 208. The number of outer leads 108 is wire bonded to the die using a second number of bond wires 210. The first number of bond wires 208 or the second number of bond wires 210 can be mounted to an active side of the die 204 opposite a non-active side of the die 204 with the thermally conductive adhesive layer 206 thereon. The conductive film 110 provides support for the die pad 112, the inner leads 106, and the outer leads 108 during the wire bonding process. An encapslant 212, such as an epoxy, is formed over the die 204, the inner leads 106 and the outer leads 108 to expose the lower surface of the conductive film 110.

Figure 3:
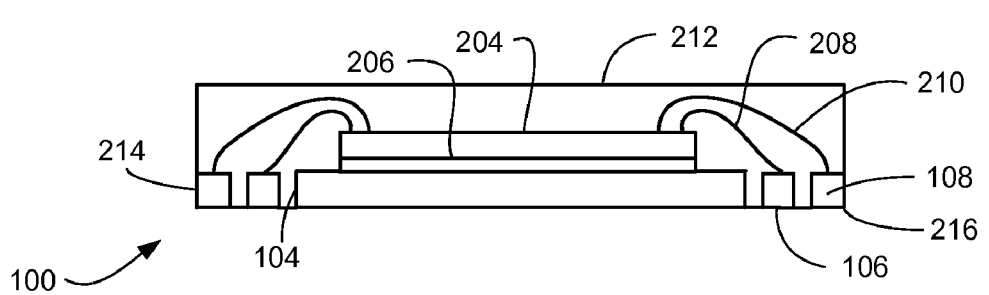
FIG. 3 is the structure of FIG. 2 after an etching process and a saw singulation process.

Referring now to FIG. 3, therein is shown the structure of FIG. 2 after an etching process and a saw singulation process. The conductive film 110 shown in FIG. 2 has been removed by a selective depth etching process. As a result of the etching process, the lower surfaces of the heat sink 104, the inner leads 106, and the outer leads 108 are exposed through the encapsulant 212. It has been discovered that selective depth etching of the conductive film 110 provides uneven and rough surfaces leaving a surface with micropeaks on the lower surfaces of the inner leads 106 and the outer leads 108 resulting in better adhesion during subsequent solder plating, such as during a solder reflow process.

After molding no detaping is required. The selective depth etching process is used to exposed the heat sink, the plurality of inner leads 106, and the plurality of outer leads 108 when the conductive film 110 is etched away leaving multiple molding cups (not shown) per panel. One matrix lead frame typically has a minimum of two mold cups per panel up to about sixteen mold cups per panel.

A solder wave process is used to plate the bottom exposed metal surfaces of the heat sink 104, the plurality of inner leads 106, and the plurality of outer leads 108. The advantage of wave soldering is it can be reflowed twice for surfaces not plated with solder or surfaces having uneven plating. The second reflow for wave induction does not cause those areas already plated during the first reflow to be double the solder thickness. The strip will come out clean and even plated. The result is reduced production cost in terms of rack cleaning, de-ionized (DI) water consumption, chemical introduction, and proper sewage maintenance.

Once wave soldering is completed, package singulation is performed. Since no metal sawing is involved during the singulation process an increase in sawing speed of 2-3 times is achieved thereby increasing throughput. In at least one embodiment, the singulation or dicing process can expose a second surface 214 of at least some of the outer leads 108. The second surface 214 may include a vertical orientation that can be substantially perpendicular to the bottom surface of the outer leads 108 and located along an outermost boundary of the exterior of the integrated circuit package system 100. The second surface 214 can be exposed along or at a corner 216 of the integrated circuit package system 100 along the outermost boundary of the integrated circuit package system 100 where the bottom surface of the outer leads 108 meets or converges with the second surface 214. It will be appreciated by those skilled in the art that the wettability of the outer leads 108 may allow solder to wick-up the exposed portions of the second surface 214 to form a fillet, thereby providing enhanced bonding to subsequent surfaces.

Figure 4:
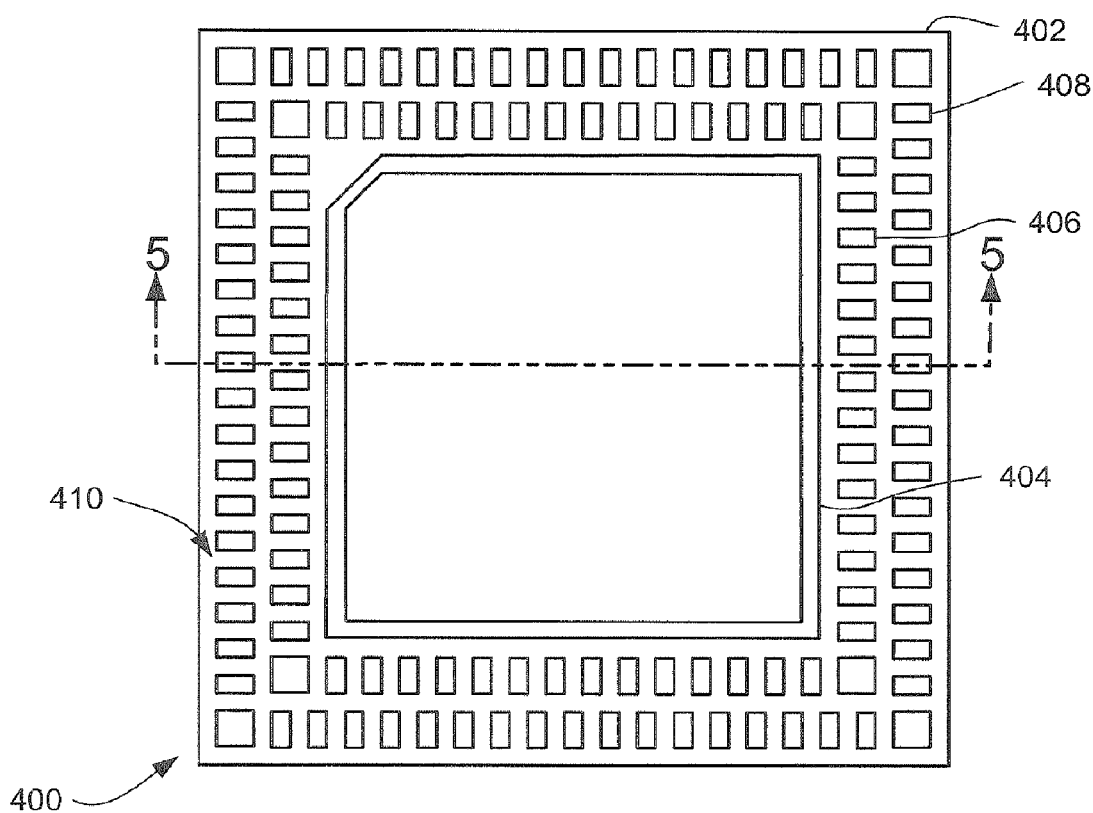
FIG. 4 is a plan view of an integrated circuit package system at an intermediate stage of manufacture in accordance with another embodiment of the present invention.

Referring now to FIG. 4, therein is shown a plan view of an integrated circuit package system 400 at an intermediate stage of manufacture in accordance with another embodiment of the present invention. The integrated circuit package system 400 includes a leadframe 402. The leadframe 402 is a conductive substrate, such as a copper (Cu) substrate, that has been processed to form a heat sink 404 surrounded by a number of inner leads 406 and a number of outer leads 408. The heat sink 404, the inner leads 406, and the outer leads 408 are formed by etching the conductive substrate using a selective depth chemical etch process. A conductive film 410 is thereby defined on the bottom of the leadframe to physically connect and maintain the spatial relationship of the heat sink 404, the inner leads 406, and the outer leads 408.

Since the features on the lead frame are supported by the conductive film 410 at the bottom of the lead frame 402, no conventional dambars or tie bars are needed to maintain the spatial relationship of the heat sink 404, the inner leads 406, and the outer leads 408. This results in a leadframe of a given size having the capability to accommodate more leads than a conventional leadframe of the same dimentions.

Figure 5:
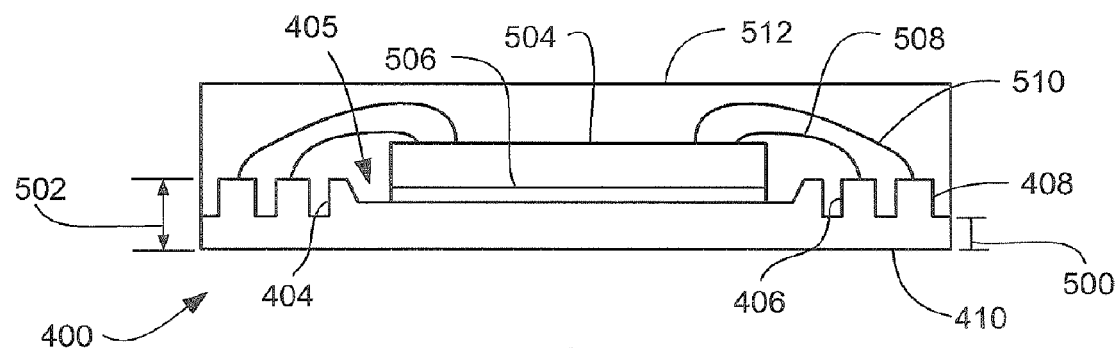
FIG. 5 is a cross-sectional view of the structure of FIG. 4 taken along line 5-5 after wire bonding and encapsulation.

Referring now to FIG. 5, therein is shown a cross-sectional view of the structure of FIG. 4 taken along line 5-5 after wire bonding and encapsulation. The heat sink 404 has a center recess 405 for reducing the total profile height of the integrated circuit package system 400. The heat sink 404 is half-etched to form the recess 405 on the heat sink 404. The entire leadframe 402 is then subjected to selective depth etching to achieve the conductive film 410.

The selective depth etching process is selectively controllable to provide a film thickness 500 of typically about 3 mil for the conductive film 410. It has been discovered that the film thickness 500 of the conductive film 410 of about 3 mil is well suited for subsequent saw singulation processes using a diamond blade in accordance with standard integrated circuit manufacturing methods.

Accordingly, a conductive substrate having a thickness 502 of 5 mil has about 40 percent of its thickness etched away in forming the heat sink 404, the inner leads, 406, and the outer leads 408 to create the conductive film 410 having the film thickness 500 that is about 3 mil. A conductive substrate having a thickness 502 of 8 mil has about 62.5 percent of its thickness etched away to create the conductive film 410 having the film thickness 500 of about 3 mil. In the case of a conductive substrate having a thickness 502 of 20 mil has 85 percent of its thickness etched away to create the conductive film having the film thickness 500 of about 3 mil.

An integrated circuit, such as a die 504 is attached to the heat sink 404 of the leadframe 402 using a thermally conductive adhesive layer 506. The thermally conductive adhesive layer 506 may be a conductive tape, conductive paste, or other suitable thermally conductive adhesive.

The number of inner leads 406 is wire bonded to the die 504 using a first number of bond wires 508. The number of outer leads 408 is wire bonded to the die using a second number of bond wires 510. The conductive film 410 provides support for the heat sink 404, the inner leads 406, and the outer leads 408 during the wire bonding process. An encapslant 512, such as an epoxy, is formed over the die 504, the inner leads 406 and the outer leads 408 to expose the lower surface of the conductive film 410.

Figure 6:
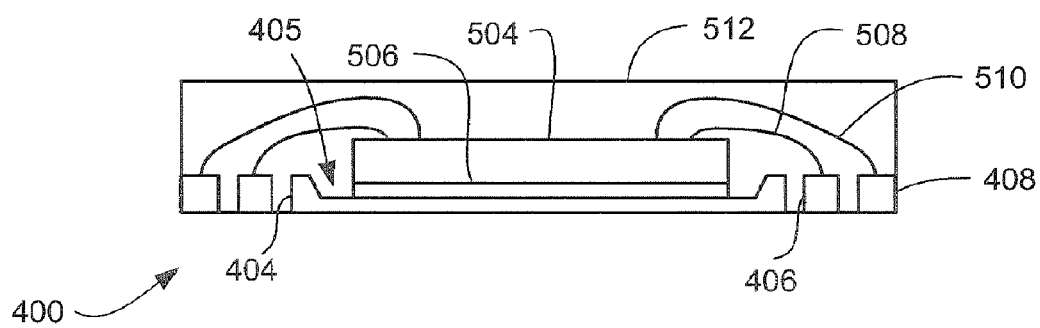
FIG. 6 is the structure of FIG. 5 after an etching process and a saw singulation process.

Referring now to FIG. 6, therein is shown the structure of FIG. 5 after an etching process and a saw singulation process. The conductve film 410 shown in FIG. 5 has been removed using a selective depth etching process and the integrated circuit package system 400 has undergone a saw singulation process. As a result of the etching process, the lower surfaces of the heat sink 404, the inner leads 406, and the outer leads 408 are exposed through the encapsulant 512. It has been discovered that selective depth etching of the conductive film 410 provides uneven and rough surfaces leaving a surface with micropeaks on the lower surfaces of the inner leads 406 and the outer leads 408 resulting in better adhesion during subsequent solder plating, such as during a solder reflow process.

After molding no detaping is required. The selective depth etching process is used to exposed the heat sink, the plurality of inner leads 406, and the plurality of outer leads 408 when the conductive film 410 is etched away leaving multiple molding cups (not shown) per panel. One matrix lead frame typically has a minimum of two mold cups per panel up to about sixteen mold cups per panel.

A solder wave process is used to plate the bottom exposed metal surfaces of the heat sink 404, the plurality of inner leads 406, and the plurality of outer leads 408. The advantage of wave soldering is it can be reflowed twice for surfaces not plated with solder or surfaces having uneven plating. The second reflow for wave induction does not cause those areas already plated during the first reflow to be double the solder thickness. The strip will come out clean and even plated. The result is reduced production cost in terms of rack cleaning, de-ionized (DI) water consumption, chemical introduction, and proper sewage maintenance.

Once wave soldering is completed, package singulation is performed. Since no metal sawing is involved during the singulation process an increase in sawing speed of 2-3 times is achieved thereby increasing throughput.

Figure 7:
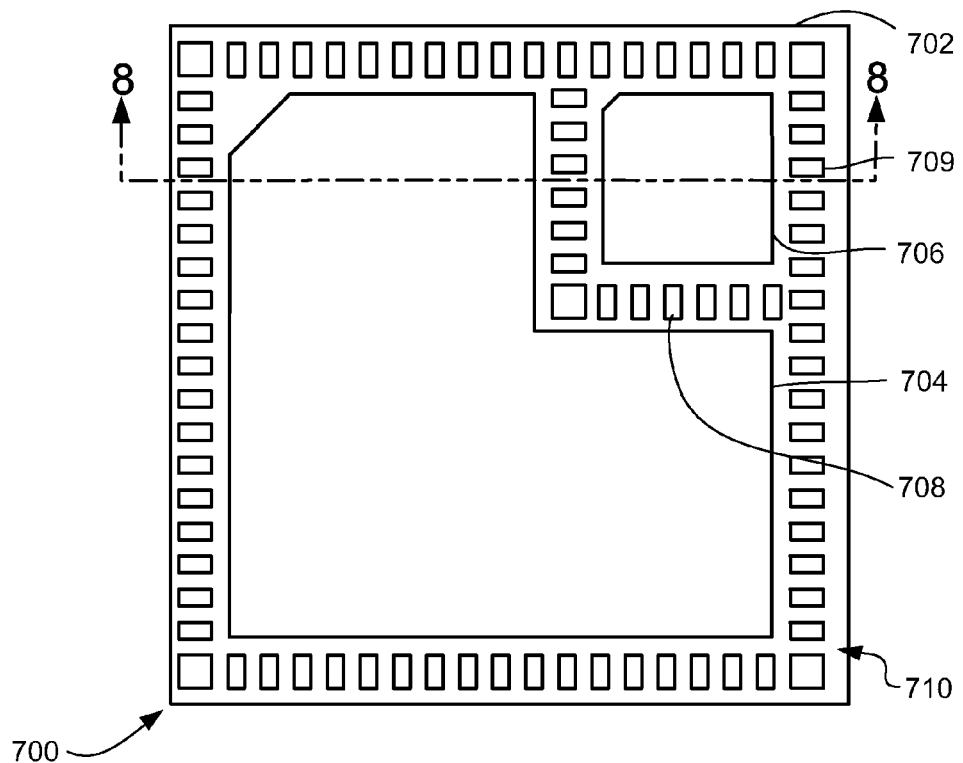
FIG. 7 is a plan view of an integrated circuit package system at an intermediate stage of manufacture in accordance with a further embodiment of the present invention.

Referring now to FIG. 7, therein is shown a plan view of an integrated circuit package system 700 at an intermediate stage of manufacture in accordance with a further embodiment of the present invention. The integrated circuit package system 700 includes a leadframe 702. The leadframe 702 is a conductive substrate, such as a copper (Cu) substrate, that has been processed to form a first heat sink 704 and a second heat sink 706 surrounded by a number of leads 709. The leads located between the first heat sink 704 and the second heat sink 706 are referred to as a number of hanging leads 708 which often are impractical to manufacture using leadframes having tie bars.

The first heat sink 704, the second heat sink 706, the leads 709, and the hanging leads 708 are formed by etching the conductive substrate using a selective depth chemical etch process. A conductive film 710 is thereby defined on the bottom of the leadframe to physically connect and maintain the spatial relationship of the first heat sink 704, the second heat sink 706, and the leads 708.

Since the features on the leadframe are supported by the conductive film 710 at the bottom of the lead frame 702, no conventional dambars or tie bars are needed to maintain the spatial relationship of the first heat sink 704, the second heat sink 706, the leads 709, and the hanging leads 708. This results in a leadframe 702 of a given size having the capability to accommodate more leads than a conventional leadframe of the same dimentions. It will be apparent to those skilled in the art that for lead frame designs having isolated leads or heat sinks, a peripheral etch at selective positions can be used to create the form factor required for a particular integrated circuit package system design.

Figure 8:
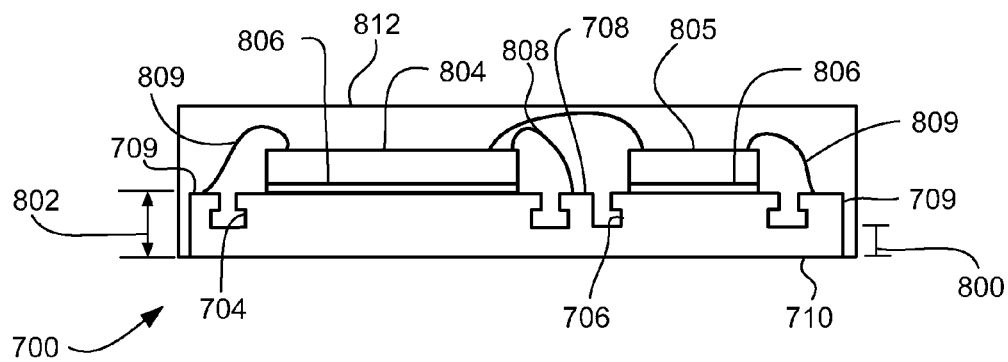
FIG. 8 is a cross-sectional view of the structure of FIG. 7 taken along line 8-8 after wire bonding and encapsulation.

Referring now to FIG. 8, therein is shown a cross-sectional view of the structure of FIG. 7 taken along line 8-8 after wire bonding and encapsulation. The selective depth etching process is selectively controllable to provide a film thickness 800 of typically about 3 mil for the conductive film 710. It has been discovered that the film thickness 800 of the conductive film 710 of about 3 mil is well suited for subsequent saw singulation processes using a diamond blade in accordance with standard integrated circuit manufacturing methods.

Accordingly, a conductive substrate having a thickness 802 of 5 mil has about 40 percent of its thickness etched away in forming the first heat sink 704, the second heat sink 706, and the leads 708 to create the conductive film 710 having the film thickness 800 that is about 3 mil. A conductive substrate having a thickness 802 of 8 mil has about 62.5 percent of its thickness etched away to create the conductive film 710 having the film thickness 800 of about 3 mil. A conductive substrate having a thickness 802 of 20 mil has 85 percent of its thickness etched away to create the conductive film 710 having the film thickness 800 of about 3 mil.

A number of integrated circuits, such as a first die 804 and a second die 805, is attached to the first heat sink 704 and the second heat sink 706 respectively using a thermally conductive adhesive layer 806. The thermally conductive adhesive layer 806 may be a conductive tape, conductive paste, or other suitable thermally conductive adhesive.

The number of leads 709 is wire bonded to the first die 804 and the second die 805 using a number of bond wires 809. The number of hanging leads 708 is wire bonded to the first die 804 using a number of bond wires 808. The conductive film 710 provides support for the first heat sink 704, the second heat sink 706, and the leads 708 during the wire bonding process. An encapsulant 812, such as an epoxy, is formed over the first die 804, the second die 805, the leads 709, and the hanging leads 708 to expose the lower surface of the conductive film 710.

Figure 9:
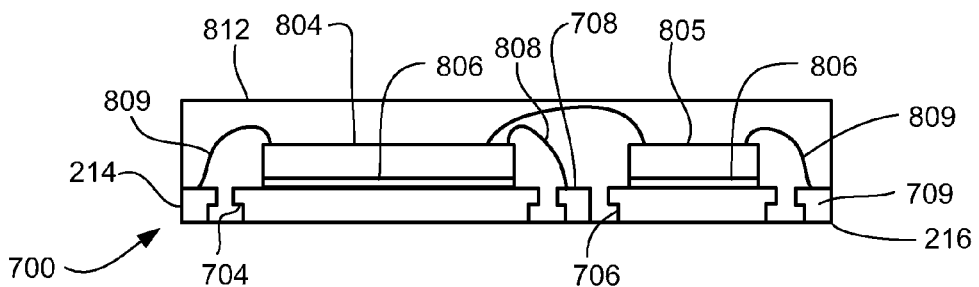
FIG. 9 is the structure of FIG. 8 after an etching process and a saw singulation process.

Referring now to FIG. 9, therein is shown the structure of FIG. 8 after an etching process and a saw singulation process. The conductive film 710 shown in FIG. 8 has been removed using a selective depth etching process and the integrated circuit package system 700 has undergone a saw singulation process. As a result of the etching process, the lower surfaces of the first heat sink 704, the second heat sink 706, the leads 709, and the hanging leads 708 are exposed through the encapsulant 812. It has been discovered that etching of the conductive film 710 provides uneven and rough surfaces leaving a surface with micropeaks on the lower surfaces of the leads 709 and the hanging leads 708 resulting in better adhesion during subsequent solder plating, such as during a solder reflow process.

After molding no detaping is required. The selective depth etching process is used to exposed the first heat sink 704, the second heat sink 706, the leads 708, and the hanging leads 709 when the conductive film 710 is etched away leaving multiple molding cups (not shown) per panel. One matrix lead frame typically has a minimum of two mold cups per panel up to about sixteen mold cups per panel.

A solder wave process is used to plate the bottom exposed metal surfaces of the first heat sink 704, the second heat sink 706, the leads 708, and the hanging leads 709. The advantage of wave soldering is it can be reflowed twice for surfaces not plated with solder or surfaces having uneven plating. The second reflow for wave induction does not cause those areas already plated during the first reflow to be double the solder thickness. The strip will come out clean and even plated. The result is reduced production cost in terms of rack cleaning, de-ionized (DI) water consumption, chemical introduction, and proper sewage maintenance.

Once wave soldering is completed, package singulation is performed. Since no metal sawing is involved during the singulation process an increase in sawing speed of 2-3 times is achieved thereby increasing throughput. In at least one embodiment, the singulation or dicing process can expose a second surface 214 of at least some of the leads 709. The second surface 214 may include a vertical orientation that can be substantially perpendicular to the bottom surface of the leads 709 and located along an outermost boundary of the exterior of the integrated circuit package system 700. The second surface 214 can be exposed along or at a corner 216 of the integrated circuit package system 700 along the outermost boundary of the integrated circuit package system 700 where the bottom surface of the leads 709 meets or converges with the second surface 214. It will be appreciated by those skilled in the art that the wettability of the leads 709 may allow solder to wick-up the exposed portions of the second surface 214 to form a fillet, thereby providing enhanced bonding to subsequent surfaces.

Figure 10:
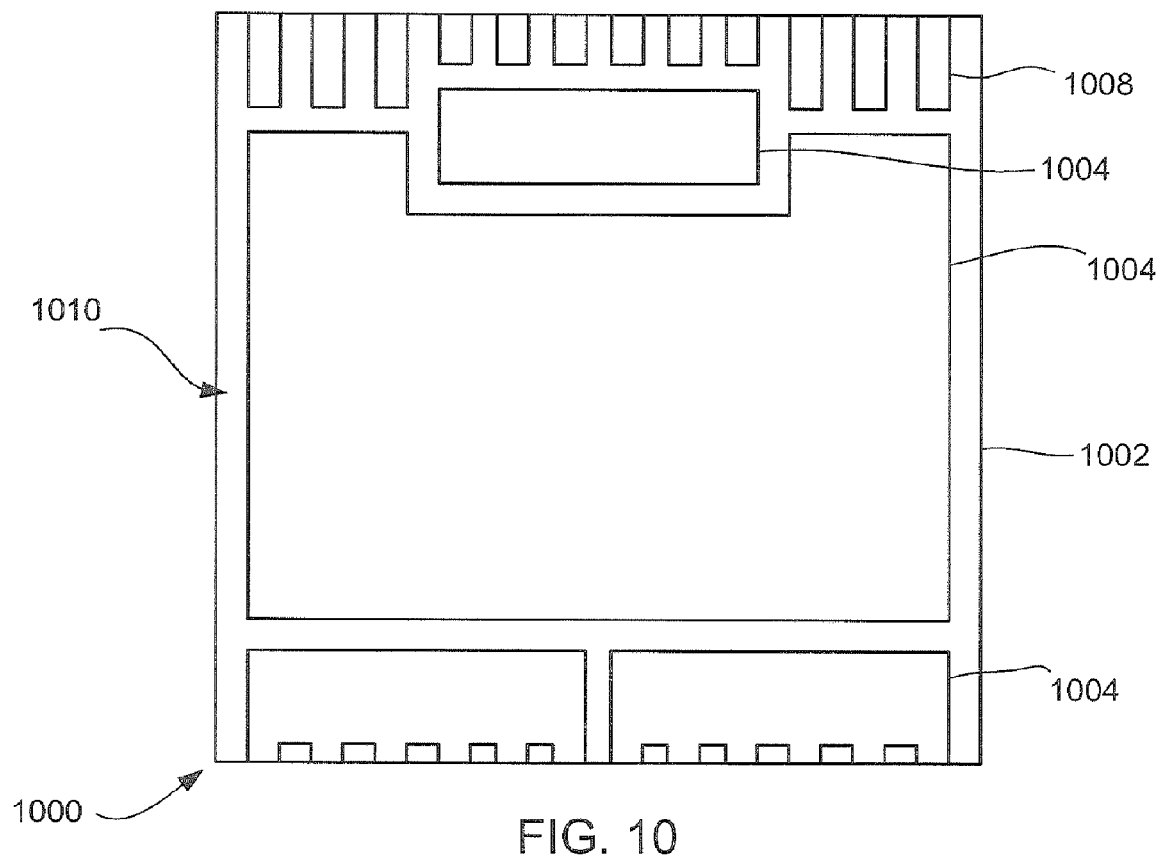
FIG. 10 is a plan view of an integrated circuit package system at an intermediate stage of manufacture in accordance with a still further embodiment of the present invention.

Referring now to FIG. 10, therein is shown a plan view of an integrated circuit package system 1000 at an intermediate stage of manufacture in accordance with a still further embodiment of the present invention. The integrated circuit package system 1000 includes a leadframe 1002 having multiple heat sinks 1004. The leadframe 1002 is a conductive substrate, such as a copper (Cu) substrate, that has been processed to form a number of heat sinks 1004 and a number of leads 1008.

The number of heat sinks 1004 and the leads 1008 are formed by etching the conductive substrate using a selective depth chemical etch process. A conductive film 1010 remains on the bottom of the leadframe to physically connect and maintain the spatial relationship of the heat sinks 1004 and the leads 1008.

Since the features on the leadframe are supported by the conductive film 1010 at the bottom of the lead frame 1002, no conventional dambars or tie bars are needed to maintain the spatial relationship of the heat sinks 1004 and the leads 1008.

Dies are attached and wire bonded before encapsulation as discussed above. The conductive film 1010 is etched as previously discussed above to expose the lower surfaces of the heat sinks 1004 and the leads 1008. A solder wave process is used to plate the bottom surfaces of the heat sinks 1004 and the leads 1008 as discussed above.

Once wave soldering is completed, package singulation is performed. Since no metal sawing is involved during the singulation process an increase in sawing speed of 2-3 times is achieved thereby increasing throughput.

It will be understood by those skilled in the art that the system of the present invention is capable of accomodating a wide variety of integrated circuit package system designs other than those disclosed herein.

Figure 11:
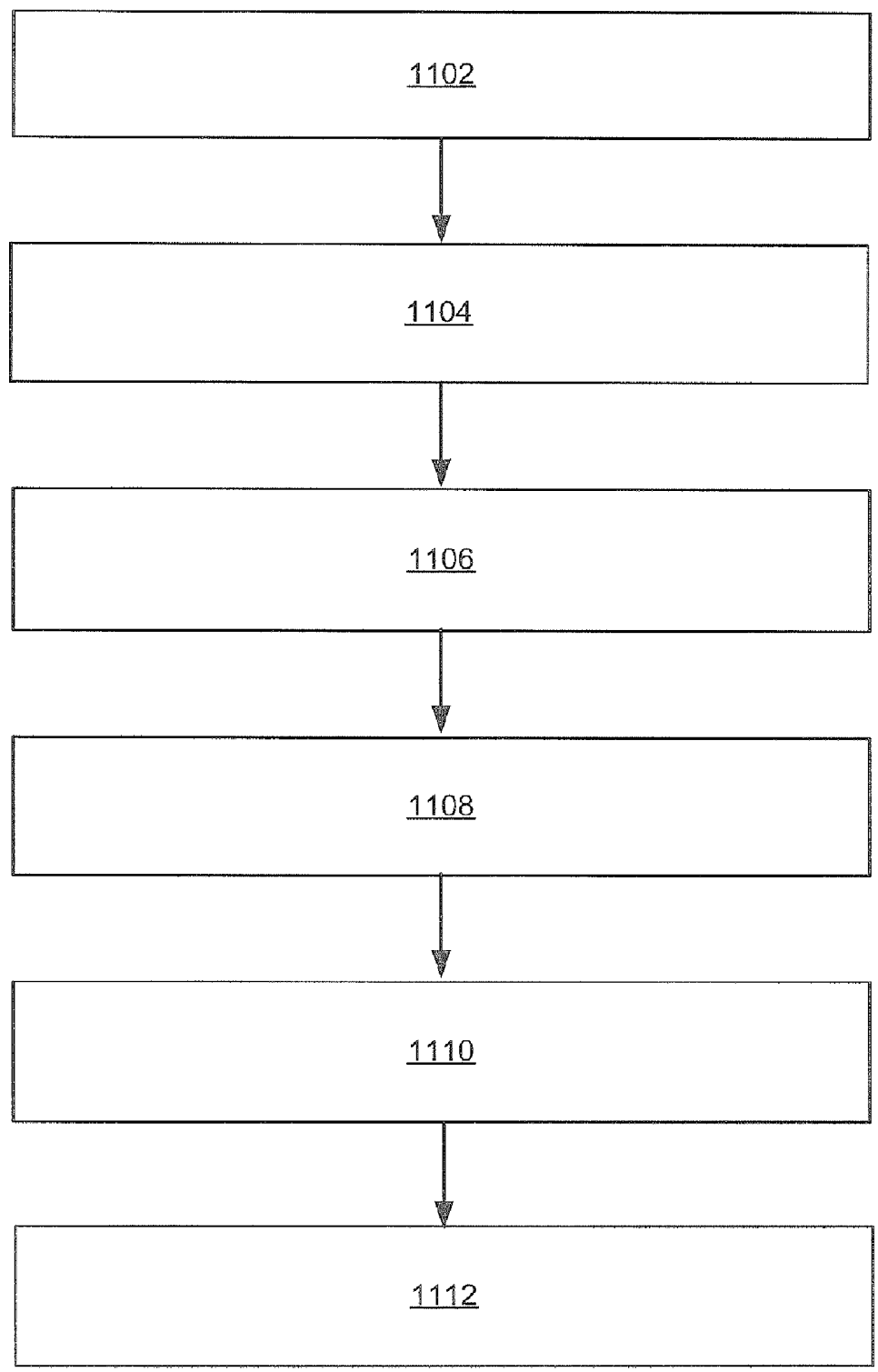
FIG. 11 is a flow chart of an integrated circuit package system for manufacturing an integrated circuit package in accordance with still another embodiment the present invention.

Referring now to FIG. 11, therein is shown a flow chart of an integrated circuit package system 1100 for manufacturing an integrated circuit package in accordance with the still another embodiment of present invention. The system 1100 includes providing a conductive substrate in a block 1102; forming a heat sink and a plurality of leads in the substrate to define a conductive film connecting the heat sink and the plurality of leads to maintain their spatial relationship in a block 1104; attaching a die to the heat sink in a block 1106; wire bonding the die to the plurality of leads in a block 1108; forming an encapsulant over the die, the heat sink, and the plurality of leads in a block 1110; and etching the conductive film to expose the encapsulant and the bottom surfaces of the heat sink and the plurality of leads in a block 1112.

It will be apparent to those skilled in the art that using the present invention integrated circuit package systems having a wide variety of form factors can be manufactured.

It has been discovered that the present invention provides a stable bonding platform for hanging heat sinks and leads due to the lack of any unsupported separation or gap between the integrated circuit package system outline dimensions and features. The present invention also is able to be used for intricate and isolated heat sink and lead designs.

The present invention increases package I/O lead terminals to accommodate higher bond wire density. An I/O lead count increase of 1.5 times for dual row standard QFN integrated circuit package systems is attainable while lead pitch can be reduced from the existing 0.5 mm to 0.35 mm.

No coverlay taping is required for the present invention as the conductive film is capable of performing the function of the coverlay tape for one-sided mold design thereby reducing manufacturing costs.

The present invention reduces or eliminates problems associated with mold flash due to the support provided by the conductive film.

Elimination of tie bars and dambars on the leads increases singulation throughput as there are no dambars holding the individual leads in peripheral arrangement resulting in cost savings the saw singulation process. Additionally, leadframe panel separation is achieved during etching of the conductive film and unit singulation is accomplished during package unit sawing.

The present invention also utilizes existing metal etching capability to expose the lower surface of the leads at specific controlled thicknesses prior to panel wave soldering.

The present invention uses wave soldering that can be reflowed twice for surfaces not plated with solder or surfaces having uneven plating. The second reflow for wave induction does not cause those areas already plated during the first reflow to be double the solder thickness. The strip will come out clean and even plated. The result is reduced production cost in terms of rack cleaning, de-ionized (DI) water consumption, chemical introduction, and proper sewage maintenance.

The present invention requires no metal sawing during the singulation process resulting in an increase in sawing speed of 2-3 times thereby increasing product throughput.

Thus, it has been discovered that the integrated circuit package system of the present invention furnishes important and heretofore unavailable solutions, capabilities, and functional advantages for integrated circuit packages. The resulting process and configurations are straightforward, economical, uncomplicated, highly versatile and effective, use conventional technologies, and are thus readily suited for manufacturing devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a conductive substrate;
   forming a heat sink and a plurality of leads in the substrate to define a conductive film connecting the heat sink and the plurality of leads to maintain their spatial relationship;
   attaching a die to the heat sink with a thermally conductive adhesive on a non-active side of the die;
   wire bonding the die to the plurality of leads;
   forming an encapsulant over the die, the heat sink, and the plurality of leads;
   etching the conductive film to expose the encapsulant and the bottom surfaces of the heat sink and the plurality of leads, and
   dicing to expose a second surface of some of the plurality of leads along an outermost boundary and a corner of the integrated circuit package system.

2. The method as claimed in claim 1 wherein forming a heat sink and a plurality of leads in the substrate to define a conductive film selectively etches the substrate a predetermined depth.

3. The method as claimed in claim 1 wherein forming a heat sink and a plurality of leads in the substrate to define a conductive film uses a selective depth chemical etch.

4. The method as claimed in claim 1 wherein etching the conductive film to expose the encapsulant and the bottom surfaces of the heat sink and the plurality of leads selectively etches the conductive film a predetermined depth.

5. The method as claimed in claim 1 wherein forming a heat sink and a plurality of leads in the substrate to define a conductive film defines a conductive film having a thickness of about 3 mm.

6. The method as claimed in claim 1 further comprising:
   wave soldering solder the plurality of leads.

7. The method as claimed in claim 1 wherein forming a heat sink and a plurality of leads in the substrate to define a conductive film forms a plurality of hanging leads.

8. A method of manufacture of an integrated circuit package system comprising:
   providing a conductive substrate;
   forming a first heat sink, a second heat sink, and a first plurality of leads between the first heat sink and the second heat sink, and a second plurality of leads in the substrate to define a conductive film connecting the heat sink, the first plurality of leads, and the second plurality of leads to maintain their spatial relationship;
   attaching a die to at least one of the first heat sink and the second heat sink with a thermally conductive adhesive on a non-active side of the die;
   wire bonding the die to the first plurality of leads;
   forming an encapsulant over the die, the first heat sink, the second heat sink, the first plurality of leads, and the second plurality of leads;
   etching the conductive film to expose the encapsulant and the bottom surfaces of the first heat sink, the second heat sink, and the first plurality of leads, and the second plurality of leads; and
   dicing to expose a second surface of the second plurality of leads along an outermost boundary and a corner of the integrated circuit package system.

9. The method as claimed in claim 8 wherein forming a first heat sink, a second heat sink, and a first plurality of leads, and the second plurality of leads in the substrate to define a conductive film selectively etches the substrate a predetermined depth.

10. The method as claimed in claim 8 wherein forming a first heat sink, a second heat sink, and a first plurality of leads, and the second plurality of leads in the substrate to define a conductive film in the substrate uses a selective depth chemical etch.

11. The system as claimed in claim 8 wherein etching the conductive film to expose the encapsulant and the bottom surfaces of the first heat sink, the second heat sink, the first plurality of leads, and the second plurality of leads selectively etches the conductive film a predetermined depth.

12. The method as claimed in claim 8 wherein forming a first heat sink, a second heat sink, a first plurality of leads, and a second plurality of leads in the substrate to define a conductive film defines a conductive film having a thickness of about 3 mm.

13. The method as claimed in claim 8 further comprising: wave soldering solder on at least the first plurality of leads.

14. The method as claimed in claim 8 further comprising:
   forming a second plurality of leads around at least a portion of the periphery of the conductive substrate; and
   wire bonding the die to the second plurality of leads.

15. The method as claimed in claim 8 further comprising:
   attaching a second die to the second heat sink;
   forming the second plurality of leads around at least a portion of the periphery of the conductive substrate; and
   wire bonding the second die to at least some of the second plurality of leads.

16. An integrated circuit package system comprising:
   a first heat sink;
   a second heat sink;
   a first plurality of leads between the first heat sink and the second heat sink;
   a second plurality of leads including a second surface exposed along an outermost boundary and a corner of the integrated circuit package system;
   a die attached to the first heat sink with a thermally conductive adhesive on a non-active side of the die;
   a first plurality of wires bonding the die to at least some of the first plurality of leads; and
   an encapsulant over the die, the first heat sink, the second heat sink, the first plurality of leads, and the second plurality of leads with the lower surfaces of the first heat sink, the second heat sink, the first plurality of leads, and the second plurality of leads exposed.

17. The system as claimed in claim 16 further comprising:
   a second plurality of leads around at least a portion of the periphery of at least the first heat sink; and
   a second plurality of wires bonding a second die to at least some of the second plurality of leads.

18. The system as claimed in claim 16, further comprising:
   a second die attached to the second heat sink; and
   a further plurality of wires bonding the second die to at least some of the first plurality of leads.

19. The system as claimed in claim 16 further comprising:
   solder on at least the first plurality of leads.

20. The system as claimed in claim 16 further comprising:
   a second plurality of leads around at least a portion of the periphery of at least the second heat sink;
   a second die attached to the second heat sink;
   a third plurality of wires bonding the second die to at least some of the first plurality of leads; and
   a fourth plurality of wires bonding the second die to at least some of the second plurality of leads.

* * * * *